(12) United States Patent
He (10) Patent No.: US 10,453,963 B2
(45) Date of Patent: Oct. 22, 2019

(54) ARRAY SUBSTRATE MANUFACTURING METHOD

(71) Applicant: HKC Corporation Limited, Shuitian Village, Shiyan Sub-district (CN)

(72) Inventor: Huailiang He, Shenzhen (CN)

(73) Assignee: HKC CORPORATION LIMITED, Shenzhen, Guangdong (CN)

( * ) Notice: Subject to any disclaimer, the term of this patent is extended or adjusted under 35 U.S.C. 154(b) by 0 days.

(21) Appl. No.: 16/068,423

(22) PCT Filed: Jan. 22, 2018

(86) PCT No.: PCT/CN2018/073601
§ 371 (c)(1),
(2) Date: Jul. 6, 2018

(87) PCT Pub. No.: WO2019/052108
PCT Pub. Date: Mar. 21, 2019

(65) Prior Publication Data
US 2019/0157460 A1  May 23, 2019

(30) Foreign Application Priority Data
Sep. 15, 2017 (CN) .......................... 2017 1 0833667

(51) Int. Cl.
*H01L 29/786* (2006.01)
*H01L 27/12* (2006.01)
(Continued)

(52) U.S. Cl.
CPC ...... *H01L 29/78609* (2013.01); *H01L 21/308* (2013.01); *H01L 21/3065* (2013.01);
(Continued)

(58) Field of Classification Search
CPC .......... H01L 29/78609; H01L 27/1259; H01L 27/1288; H01L 21/308; H01L 21/3065;
(Continued)

(56) References Cited

U.S. PATENT DOCUMENTS

| | | | |
|---|---|---|---|
| 7,166,502 B1 | 1/2007 | Kwon | |
| 2009/0047749 A1* | 2/2009 | Lin | ...................... H01L 27/1214 438/29 |
| 2009/0302320 A1* | 12/2009 | Takahashi | ........... H01L 27/1288 257/59 |

FOREIGN PATENT DOCUMENTS

| | | |
|---|---|---|
| CN | 101211119 A | 7/2008 |
| CN | 101369539 A | 2/2009 |

* cited by examiner

*Primary Examiner* — Karen Kusumakar
(74) *Attorney, Agent, or Firm* — Muncy, Geissler, Olds & Lowe, P.C.

(57) ABSTRACT

This application discloses a method for manufacturing an array substrate. The array substrate manufacturing method includes: providing a first substrate; forming gate layers on the first substrate; forming a gate insulation layer on the first substrate, and covering the gate layers; forming an amorphous silicon layer on the gate insulation layer; forming a metal layer on the amorphous silicon layer; forming a photo-sensitive photoresist layer on the metal layer; etching the amorphous silicon layer by using inert gas or nitrogen plasma, to form a groove; forming source layers and a drain layer; removing the photo-sensitive photoresist layer; and forming a passivation layer on the source layers, where a baking process is performed on the photo-sensitive photoresist layer, so that the photo-sensitive photoresist layer flows to some extent so as to form a protection layer, so as to cover the metal layer in a non-active switch channel region.

20 Claims, 12 Drawing Sheets

(51) Int. Cl.
*H01L 29/66* (2006.01)
*H01L 21/306* (2006.01)
*H01L 21/3065* (2006.01)
*H01L 21/308* (2006.01)
*H01L 21/3213* (2006.01)

(52) U.S. Cl.
CPC ...... *H01L 21/30604* (2013.01); *H01L 27/127* (2013.01); *H01L 27/1222* (2013.01); *H01L 27/1259* (2013.01); *H01L 27/1288* (2013.01); *H01L 29/66765* (2013.01); *H01L 29/78669* (2013.01); *H01L 29/78696* (2013.01); *H01L 21/32132* (2013.01)

(58) Field of Classification Search
CPC ......... H01L 21/30604; H01L 29/78669; H01L 29/66765; H01L 27/127; H01L 27/1222; H01L 29/78696; H01L 21/32132
See application file for complete search history.

ARRAY SUBSTRATE MANUFACTURING METHOD

BACKGROUND

Technical Field

This application relates to a manufacturing manner, and in particular, to a method for manufacturing an array substrate.

Related Art

With the advancement of technologies, liquid crystal displays having advantages of being power-saving, radiation-free, small-sized, and a flat square, and having low power consumption, high definition, stable image quality, and the like gain more popularity. Especially, because various information products such as mobile phones, notebook computers, digital cameras, PDAs, and liquid crystal screens become more popular, a demand for displays increases greatly. Therefore, switch array liquid crystal displays (Thin Film Transistor Liquid Crystal Display, TFT-LCD) satisfying a growing requirement for a high-definition pixel design and having advantages of high image quality, low power consumption, and radiation free have become the mainstream of the market. An array substrate is one of important components of an assembly display.

An amorphous silicon (a-Si:H) thin film transistor (TFT) is applied to a drive backplane of a display panel. A process technology of the amorphous silicon TFT is relatively stable, the technology is relatively mature, and costs are low. Therefore, the amorphous silicon TFT is widely applied to current LCD display industries. Due to a recently-developed technology of four photo etching processes (4-PEPs), time and cost advantages of the backplane of the amorphous silicon (a-Si:H) TFT are further improved, and panel manufacturers start large-scale mass production. However, for relatively stable five photo etching processes (5-PEPs), in the 4-PEPs, there are some problems to be optimized and overcome. In two wet etching processes and two dry etching processes of the 4-PEPs, due to a line width (CD Bias) difference (a line width loss at a source layer is relatively large, and a line width loss of the amorphous silicon is relatively small) between the amorphous silicon (a-Si:H) and the source layer (M2), there may be a bulging tail end on the amorphous silicon layer below the source layer. The tail end causes a leakage current of the TFT, and as a result, affects quality of the display panel.

SUMMARY

To resolve the foregoing technical problem, an objective of this application is to provide a method for manufacturing an array substrate, to reduce a tail end on an amorphous silicon layer caused by a line width difference between wet etching on a source layer and dry etching on the amorphous silicon layer, thereby effectively preventing photo leakage current of a thin film transistor (TFT) caused by the tail end, and ensuring display quality of a panel.

The objective of this application is implemented and the technical problem is resolved by using the following technical solution. A method for manufacturing an array substrate provided in this application includes: providing a first substrate; forming gate layers on the first substrate; forming a gate insulation layer on the first substrate, and covering the gate layers; forming an amorphous silicon layer on the gate insulation layer; forming a metal layer on the amorphous silicon layer; forming a photo-sensitive photoresist layer on the metal layer; etching the amorphous silicon layer by using inert gas or nitrogen plasma, to form a groove; forming source layers and a drain layer; removing the photo-sensitive photoresist layer; and forming a passivation layer on the source layers, where a baking process is performed on the photo-sensitive photoresist layer, so that the photo-sensitive photoresist layer flows to some extent so as to form a protection layer, so as to cover the metal layer in a non-active switch channel region.

A method for manufacturing an array substrate provided according to another objective of this application includes: providing a first substrate; forming gate layers on the first substrate; forming a gate insulation layer on the first substrate, and covering the gate layers; forming an amorphous silicon layer on the gate insulation layer; forming a metal layer on the amorphous silicon layer; forming a photo-sensitive photoresist layer on the metal layer; etching the amorphous silicon layer by using inert gas or nitrogen plasma, to form a groove, and forming source layers and a drain layer; removing the photo-sensitive photoresist layer; and forming a passivation layer on the source layers, where the step of etching the amorphous silicon layer by using inert gas or nitrogen plasma, to form a groove includes performing first wet etching, first dry etching, second dry etching, second wet etching, and third dry etching, and a mask is a gray scale mask or a half tone mask.

The technical problem may further be resolved in this application by using the following technical measures.

In an embodiment of this application, in the manufacturing method, the step of forming a photo-sensitive photoresist layer on the source layers includes: coating the photo-sensitive photoresist layer, and enabling film thickness thereof to be greater than or equal to 2.5 μm; performing exposure processing by using the mask, reducing film thickness of the photo-sensitive photoresist layer corresponding to an active switch channel region, forming a groove on the active switch channel region, and enabling film thickness of the groove to be less than or equal to 0.5 μm.

In an embodiment of this application, in the manufacturing method, the step of etching the amorphous silicon layer by using inert gas or nitrogen plasma, to form a groove includes: performing first wet etching, including: performing first wet etching on the metal layer, and etching away the metal layer not covered by the photo-sensitive photoresist layer.

In an embodiment of this application, in the manufacturing method, the step of etching the amorphous silicon layer by using inert gas or nitrogen plasma, to form a groove includes: performing first dry etching, including: etching the amorphous silicon layer, and etching away the amorphous silicon layer not covered by the photo-sensitive photoresist layer, where a baking process is performed on the photo-sensitive photoresist layer to cover the metal layer; and performing second dry etching, including: performing ashing on an active switch channel region on the photo-sensitive photoresist layer, and etching away the groove on the photo-sensitive photoresist layer, to expose a part of the metal layer.

In an embodiment of this application, in the manufacturing method, the step of etching the amorphous silicon layer by using inert gas or nitrogen plasma, to form a groove includes: performing second wet etching, including: etching the exposed part of the metal layer on the active switch channel region, forming the source layers and the drain layer, and exposing a part of the amorphous silicon layer.

In an embodiment of this application, in the manufacturing method, the step of etching the amorphous silicon layer by using inert gas or nitrogen plasma, to form a groove includes: performing third dry etching, including: etching the exposed part of the amorphous silicon layer by using the inert gas or the nitrogen plasma, to form the groove on the amorphous silicon layer.

In an embodiment of this application, in the manufacturing method, the inert gas may be helium gas, neon gas, argon gas, krypton gas, xenon gas, or radon gas.

In an embodiment of this application, in the manufacturing method, nitrogen in the nitrogen plasma may be provided by the nitrogen group element and a compound thereof.

In an embodiment of this application, in the manufacturing method, a material of the gate insulation layer is silicon nitride, silicon oxide, silicon oxynitride, aluminum oxide, or hafnium oxide.

By means of this application, a bulging part at an edge tail end of the amorphous silicon layer caused by a difference between a relatively large line width difference of wet etching on the source layers and a relatively small line width difference of the amorphous silicon layer can be reduced, and the relatively small bulging part at the edge tail end obviously suppresses a leakage current of an active switch component. The baking process is performed on the photo-sensitive photoresist layer, so that a part of the photo-sensitive photoresist layer is transformed into a liquid form, and the part of the photo-sensitive photoresist layer in the liquid form is used to cover the metal layer and the amorphous silicon layer.

DETAILED DESCRIPTION

The following embodiments are described with reference to accompanying drawings, to provide examples of particular implementable embodiments of this application. Direction terms described in this application, for example, "above", "below", "front", "behind", "left", "right", "internal", "external", and "lateral face", indicate only directions with reference to the accompanying drawings. Therefore, the used direction terms are intended to describe and understand this application, rather than limiting this application.

The accompanying drawings and descriptions are considered as essentially illustrative instead of limitative. In the drawings, units having similar structures are indicated by a same reference number. In addition, for ease of understanding and description, sizes and thicknesses of components shown in the accompanying drawings are randomly shown, but this application is not limited thereto.

In the accompanying drawings, for the purpose of clarity, thicknesses of layers, sheets, substrates, and the like are enlarged. In the accompanying drawings, for ease of understanding and description, thicknesses of layers and sheets are enlarged. It should be understood that, when it is described that components such as layers, sheets, or bases are located "on" another component, the component may be directly located on the another component, or there may be a component therebetween.

In addition, in this specification, unless otherwise described clearly, the term "include" shall be understood as including a component, but not excluding any other components. In addition, in this specification, "on" means that a component is located above or below a target component, and does not mean that a component needs to be located on the top based on a gravity direction.

To further describe technical means used in this application to achieve a preset application objective and technical effects of this application, the following describes, in detail with reference to the accompanying drawings and preferred embodiments, specific implementations, structures, features, and effects of a method for manufacturing an array substrate provided based on this application, and detailed descriptions are as follows.

Figure 1:
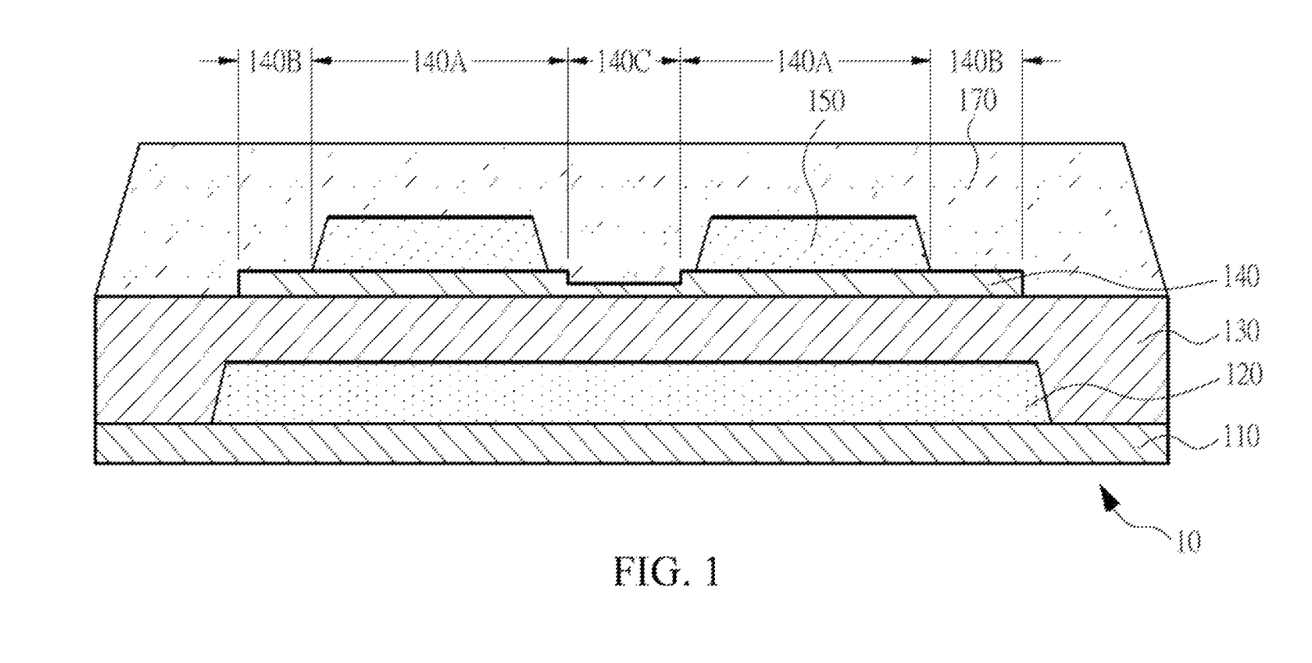
FIG. 1 is a schematic cross-sectional view of an example of a bulging tail end of an amorphous silicon layer in an array substrate.

FIG. 1 is a schematic cross-sectional view of an example of a bulging tail end of an amorphous silicon layer in an array substrate. Referring to FIG. 1, a display panel 10 includes a first substrate 110; a plurality of gate layers 120, formed on the first substrate 110; a gate insulation layer 130, formed on the first substrate 110, and covering the gate layers 120; an amorphous silicon layer 140, formed on the gate insulation layer 130; a plurality of source layers 150, formed on the amorphous silicon layer 140; and a passivation layer 170, formed on the gate insulation layer 130, and covering the source layers 150 and the amorphous silicon layer 140. A bulging part at an edge tail end 140B of the amorphous silicon layer 140 causes a leakage current of an active switch component.

Figure 2A:
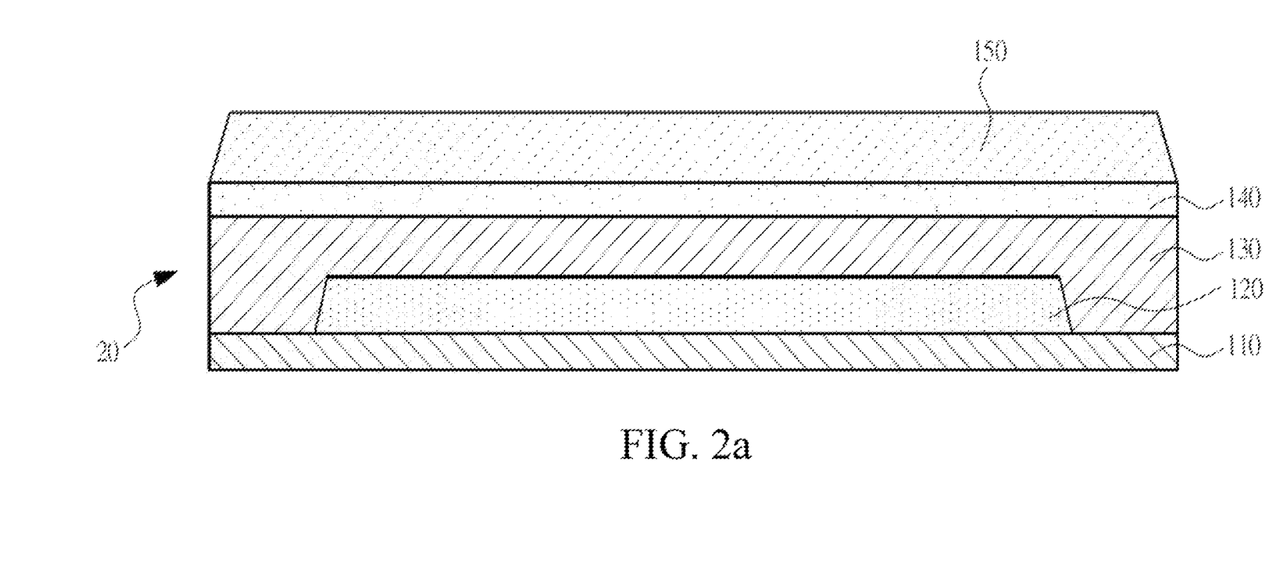
FIG. 2a to FIG. 2i are schematic cross-sectional views of a display panel manufacturing method according to an embodiment of this application.
Figure 2B:
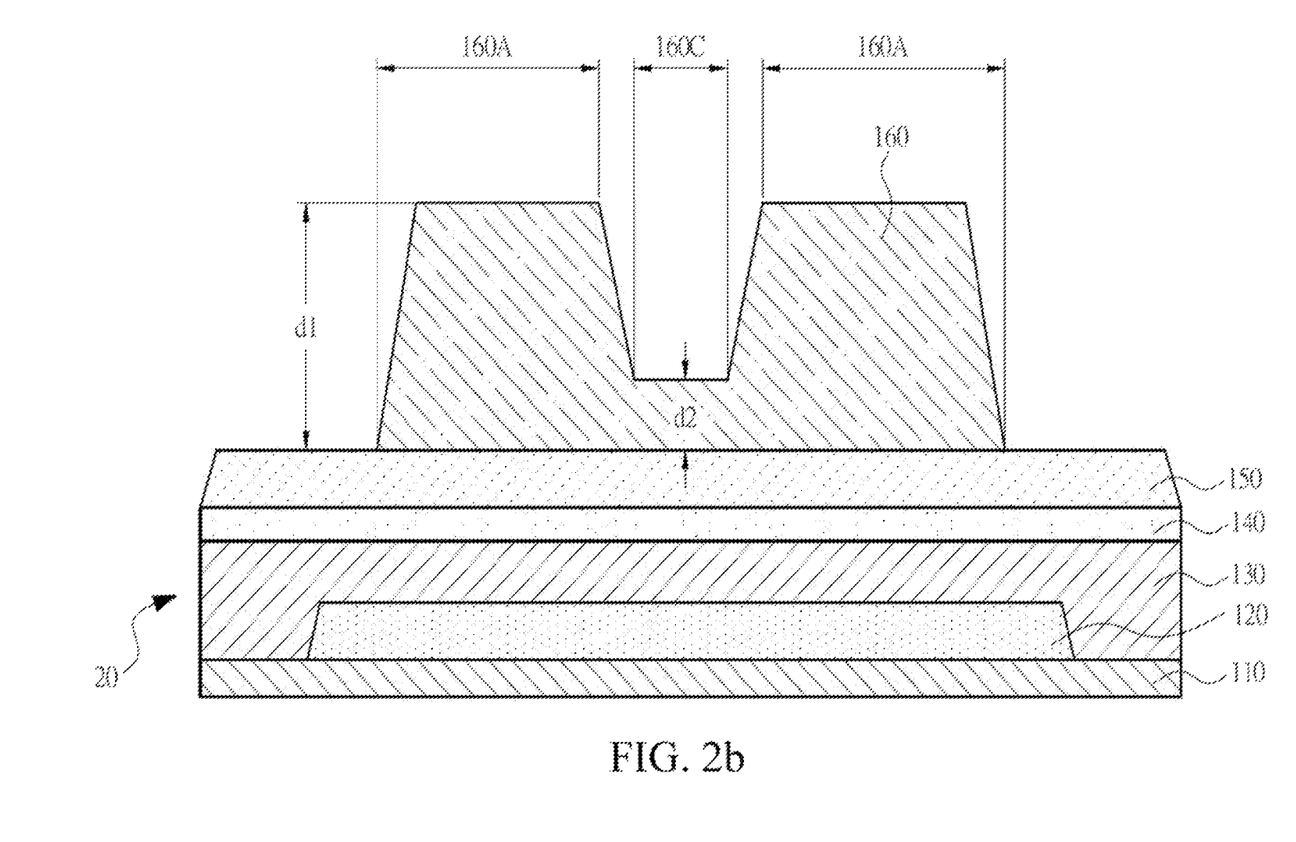
Figure 2C:
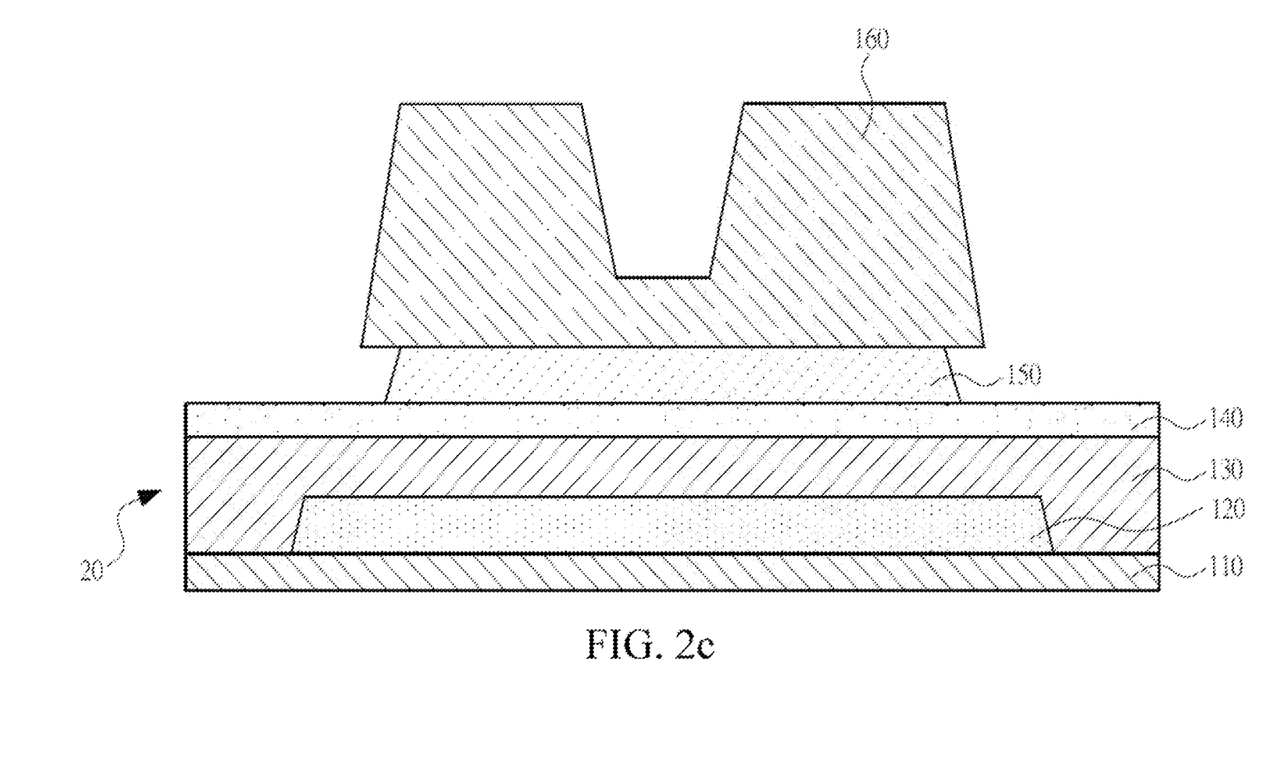
Figure 2D:
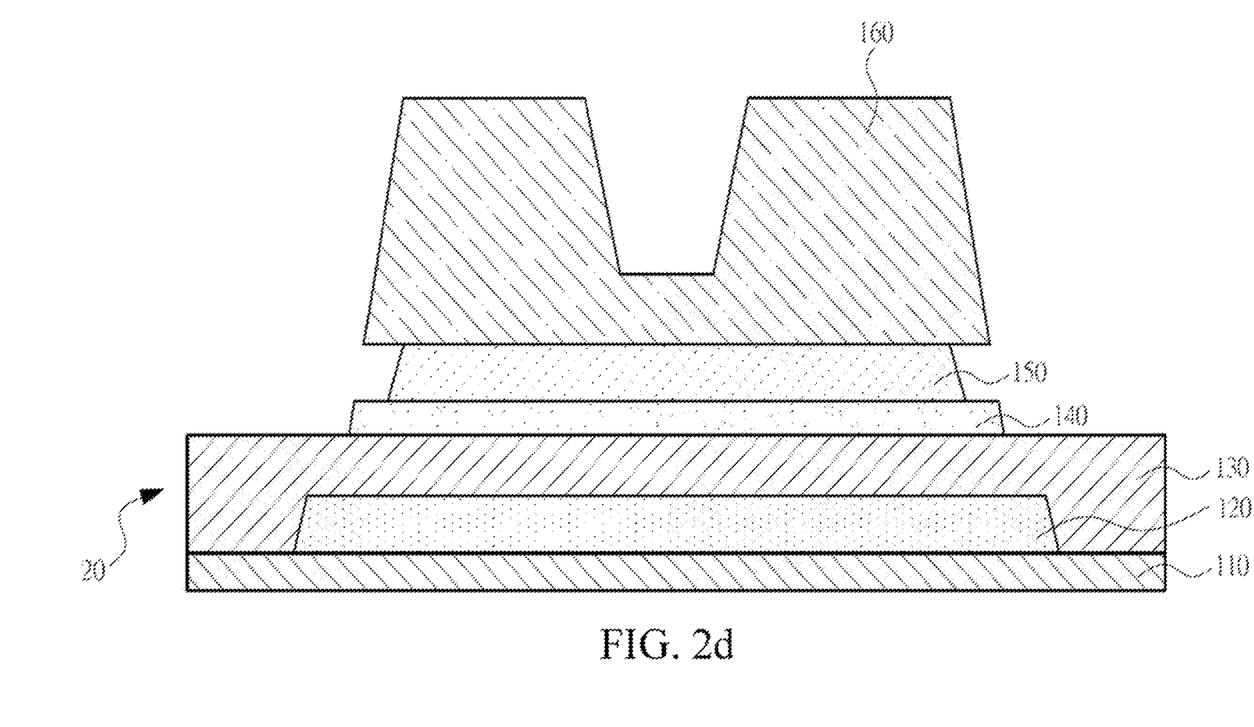
Figure 2E:
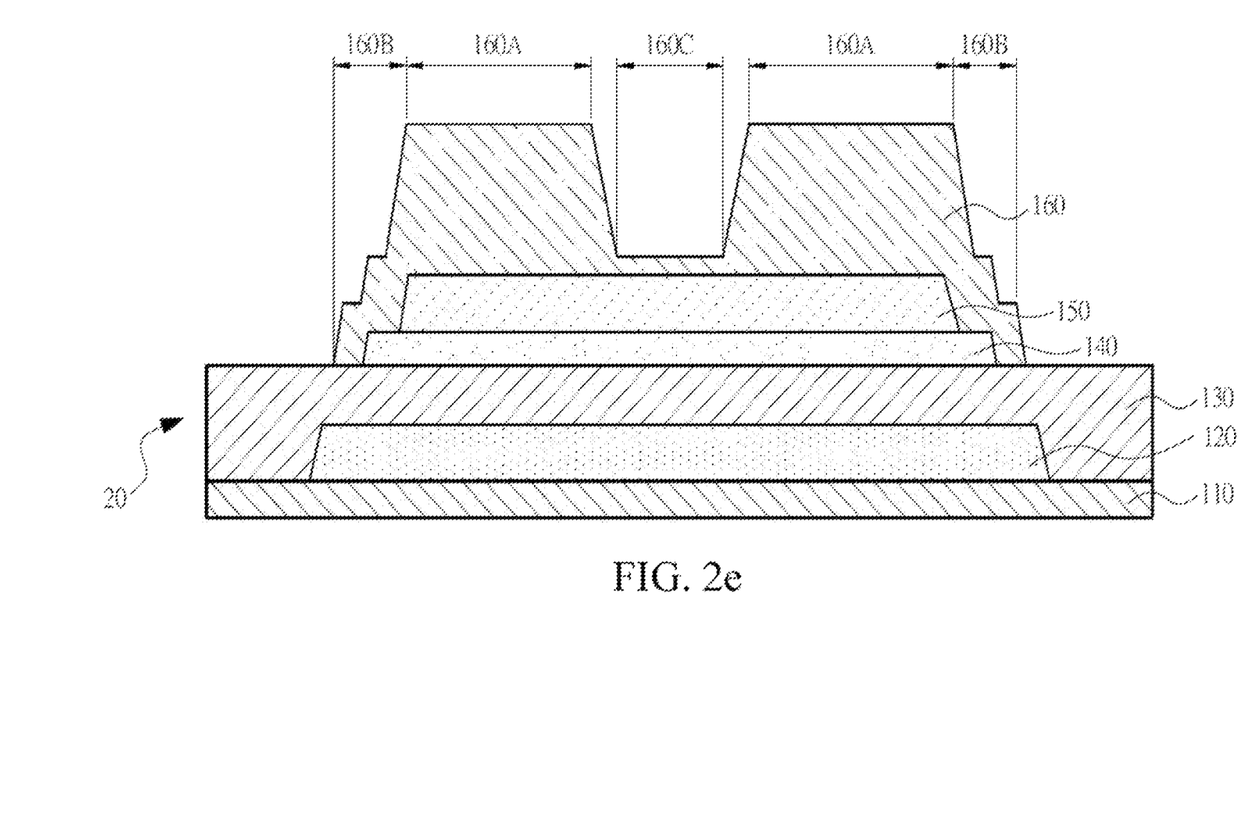
Figure 2F:
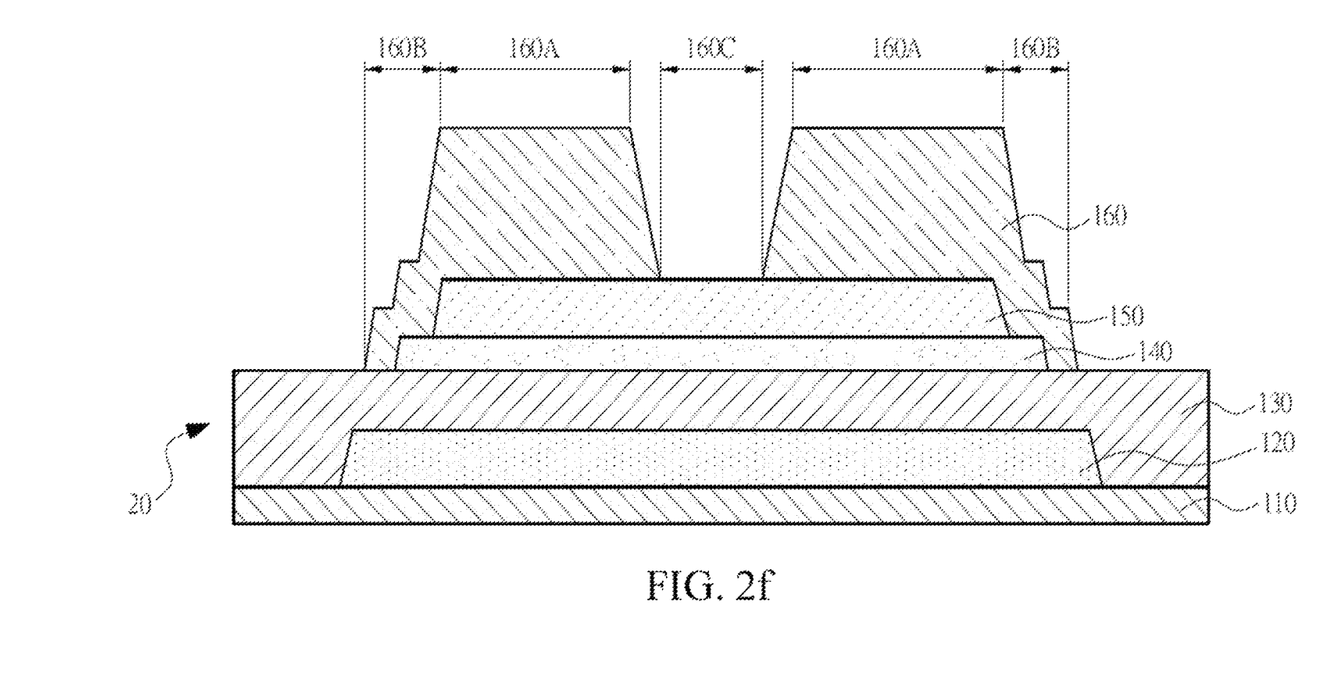
Figure 2G:
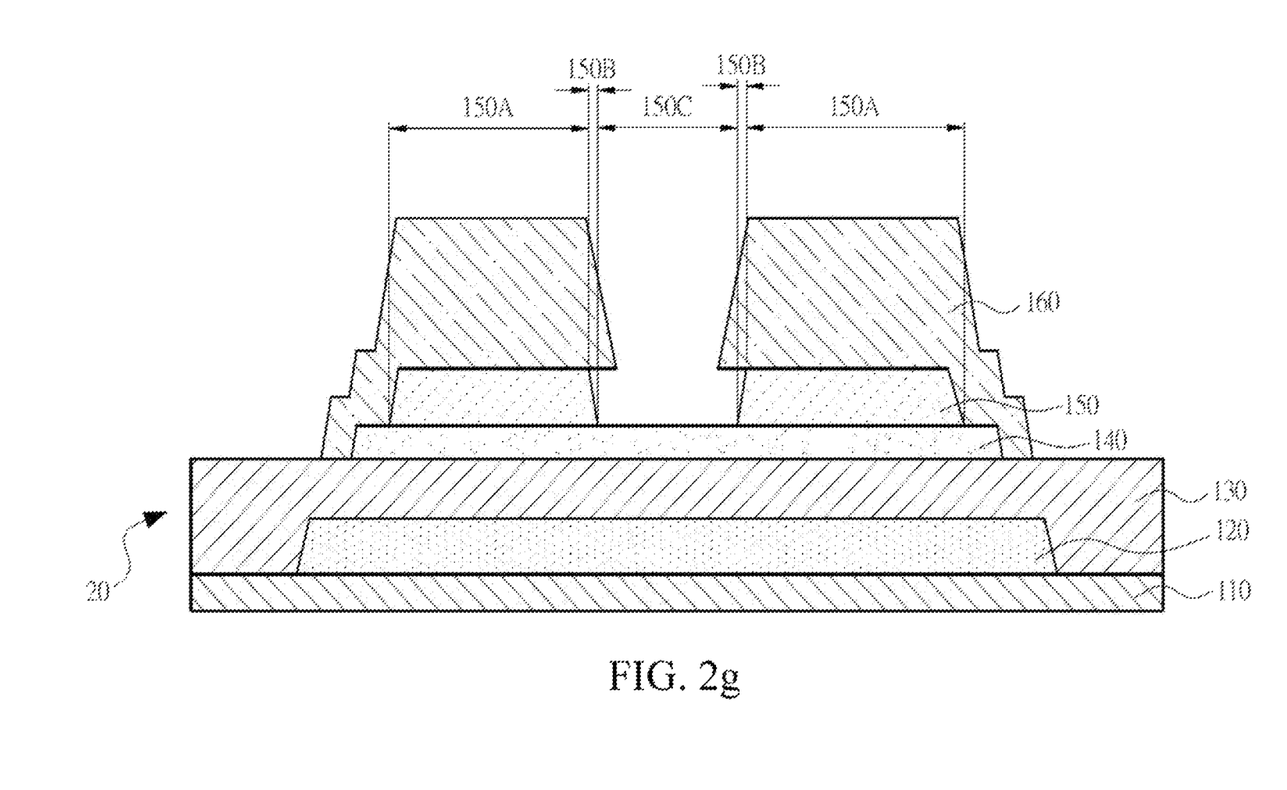
Figure 2H:
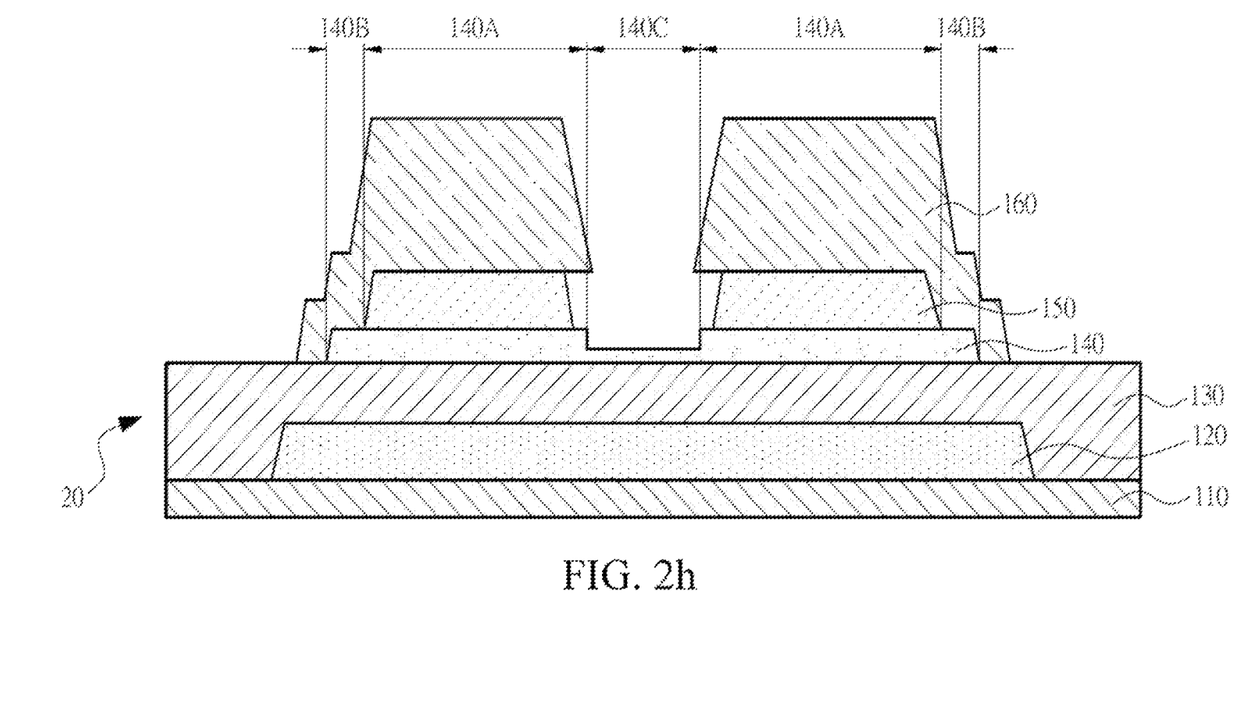

FIG. 2a to FIG. 2i are schematic cross-sectional views of a display panel manufacturing method according to an embodiment of this application. Referring to FIG. 2e and FIG. 2h, an array substrate 20 includes the first substrate 110; the plurality of gate layers 120, formed on the first substrate 110; the gate insulation layer 130, formed on the first substrate 110 and covering the gate layers 120; amorphous silicon layers 140 and 140A, formed on the gate insulation layer 130, and etched by using inert gas or nitrogen plasma to form a groove 140C; a plurality of source layers 150 and 150A, formed on the amorphous silicon layers 140 and 140A; and photo-sensitive photoresist layers 160, 160A, and 160B, formed on the source layers 150 and 150A. The photo-sensitive photoresist layers 160, 160A, and 160B can cover the source layers 150 and 150A and the amorphous silicon layers 140 and 140A.

Referring to FIG. 2h, in an embodiment, the inert gas may be helium gas, neon gas, argon gas, krypton gas, xenon gas, or radon gas.

Referring to FIG. 2h, in an embodiment, nitrogen in the nitrogen plasma is provided by the nitrogen group element and a compound thereof.

Referring to FIG. 2h, in an embodiment, a material of the gate insulation layer 130 is silicon nitride, silicon oxide, silicon oxynitride, aluminum oxide, or hafnium oxide.

Referring to FIG. 2a to FIG. 2h, a method for manufacturing the array substrate 20 includes: providing a first substrate 110; forming gate layers 120 on the first substrate 110; forming a gate insulation layer 130 on the first substrate 110, and covering the gate layers 120; forming an amorphous silicon layer 140 on the gate insulation layer 130;

forming a metal layer 150 on the amorphous silicon layer 140; forming a photo-sensitive photoresist layer 160 on the metal layer 150; etching the amorphous silicon layer 140 by using inert gas or nitrogen plasma, to form a groove 140C; forming a source layer 150 and a drain layer 150; removing the photo-sensitive photoresist layer 160; and forming a passivation layer 170 on the source layer 150. After first dry etching, a baking process is performed on the photo-sensitive photoresist layer 160, so that the photo-sensitive photoresist layer 160 flows to some extent so as to generate a protection layer, so as to cover the metal layer 150 in a non-active switch channel region, thereby effectively preventing an excessively large line width difference of the metal layer 150 caused by second wet etching of the metal layer 150.

Referring to FIG. 2b, in an embodiment, in the manufacturing method, the step of forming a photo-sensitive photoresist layer 160 on the metal layer 150 includes: coating the photo-sensitive photoresist layer 160, and enabling film thickness d1 thereof to be greater than or equal to 2.5 µm; performing exposure processing by using a mask, and reducing film thickness d2 of the photo-sensitive photoresist layer 160C corresponding to an active switch channel region, forming a groove 160C in the active switch channel region, and enabling film thickness d2 of the groove to be less than or equal to 0.5 µm.

Referring to FIG. 2a to FIG. 2h, in an embodiment, in the manufacturing method, the step of etching the amorphous silicon layer 140 by using inert gas or nitrogen plasma, to form a groove 140C includes: performing first wet etching, including: performing first wet etching on the metal layer 150, and etching away the metal layer 150 not covered by the photo-sensitive photoresist layer 160; performing first dry etching, including: etching the amorphous silicon layer 140, and etching away the amorphous silicon layer 140 not covered by the photo-sensitive photoresist layer 160, where a baking process is performed on the photo-sensitive photoresist layer 160, to transform a part of the photo-sensitive photoresist layer 160 into a liquid form, and the part of the photo-sensitive photoresist layer 160 in the liquid form covers the metal layer 150 and the amorphous silicon layer 140; performing second dry etching, including: performing ashing on the active switch channel region on the photo-sensitive photoresist layer 160C, and etching away the groove 160C on the photo-sensitive photoresist layer 160, to expose parts of the metal layer 150; performing second wet etching, including: etching the exposed parts of the metal layers 150B and 150C exposed in the active switch channel region, forming the source layer 150 and the drain layer 150, and exposing a part of the amorphous silicon layer 140; and performing third dry etching, including: etching the exposed part of the amorphous silicon layer 140 by using the inert gas or the nitrogen plasma, to form the groove 140C on the amorphous silicon layer.

Referring to FIG. 2h, in an embodiment, in the manufacturing method, the inert gas may be helium gas, neon gas, argon gas, krypton gas, xenon gas, or radon gas.

Referring to FIG. 2h, in an embodiment, in the manufacturing method, nitrogen in the nitrogen plasma is provided by the nitrogen group element and a compound thereof.

In an embodiment, in the manufacturing method, the mask is a gray scale mask or a half tone mask.

A multi-gray scale mask may be classified into a gray-tone mask and a half tone mask. The gray-tone mask is: manufacturing a slit pattern finer than resolution of an exposure machine, and shielding a part of a light source by using the slit pattern, to achieve an effect of semi exposure.

In another aspect, the half tone mask is: performing semi exposure by using a semi-transmissive film. Because in the foregoing two manners, three exposure layers, namely, an exposed part, a semi-exposed part, and an unexposed part, can be presented after one exposure process, photoresists having two types of thickness can be formed after developing (by means of a thickness difference of the photoresists, an image can be written onto a panel substrate by using relatively fewer sheets, and the production efficiency of panels can be improved). If the mask is the half tone mask, costs of the mask are slightly higher than costs of a common mask.

Figure 3:
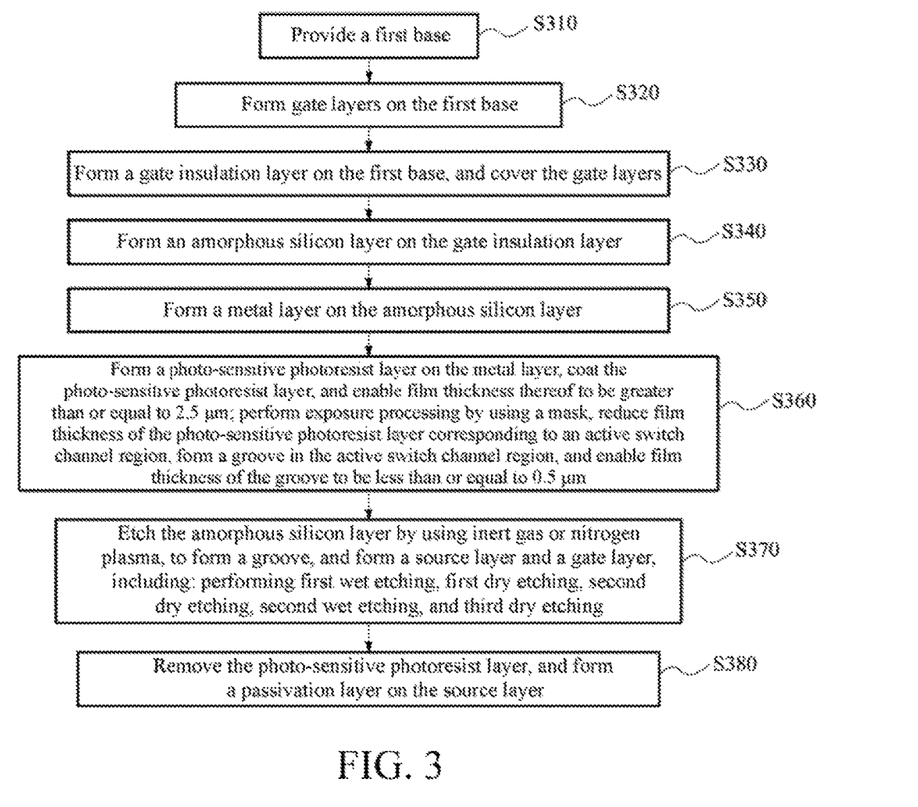
FIG. 3 is a flowchart of a method for manufacturing an array substrate according to an embodiment of this application.

FIG. 3 is a flowchart of a method for manufacturing an array substrate according to an embodiment of this application. Referring to FIG. 3, in step S310, a first substrate is provided.

Referring to FIG. 3, in step S320, gate layers are formed on the first substrate.

Referring to FIG. 3, in step S330, a gate insulation layer is formed on the first substrate, and the gate layer is covered.

Referring to FIG. 3, in step S340, an amorphous silicon layer is formed on the gate insulation layer.

Referring to FIG. 3, in step S350, a metal layer is formed on the amorphous silicon layer.

Referring to FIG. 3, in step S360, a photo-sensitive photoresist layer is formed on the metal layer, the photo-sensitive photoresist layer is coated, and film thickness thereof is enabled to be greater than or equal to 2.5 µm; exposure processing is performed by using a mask, film thickness of the photo-sensitive photoresist layer corresponding to an active switch channel region is reduced, a groove is formed in the active switch channel region, and film thickness of the groove is enabled to be less than or equal to 0.5 µm.

Referring to FIG. 3, in step S370, the amorphous silicon layer is etched by using inert gas or nitrogen plasma, to form a groove, and a source layer and a drain layer are formed. This step includes: performing first wet etching, first dry etching, second dry etching, second wet etching, and third dry etching.

Referring to FIG. 3, in step S380, the photo-sensitive photoresist layer is removed, and a passivation layer is formed on the source layer.

Figure 3A:
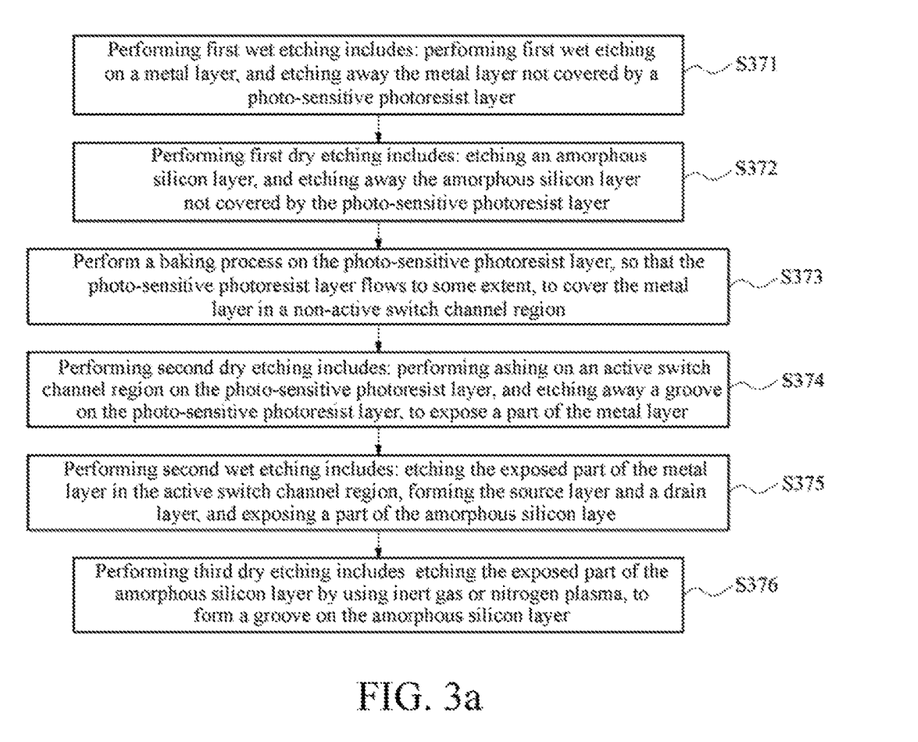
FIG. 3a is a flowchart of a method for manufacturing an amorphous silicon layer in an array substrate according to an embodiment of this application.

FIG. 3a is a flowchart of a method for manufacturing an amorphous silicon layer in an array substrate according to an embodiment of this application. Referring to FIG. 3a, in step S371, the performing first wet etching includes: performing first wet etching on the metal layer, and etching away the metal layer not covered by the photo-sensitive photoresist layer.

Referring to FIG. 3a, in step S372, the performing first dry etching includes: etching the amorphous silicon layer, and etching away the amorphous silicon layer not covered by the photo-sensitive photoresist layer.

Referring to FIG. 3a, in step S373, a baking process is performed on the photo-sensitive photoresist layer, so that the photo-sensitive photoresist layer flows to some extent so as to cover the metal layer in a non-active switch channel region.

Referring to FIG. 3a, in step S374, the performing second dry etching includes: performing ashing on the active switch channel region on the photo-sensitive photoresist layer, and etching away the groove on the photo-sensitive photoresist layer, to expose a part of the metal layer.

Referring to FIG. 3a, in step S375, the performing second wet etching includes: etching the exposed part of the metal layer in the active switch channel region, forming the source layer and the drain layer, and exposing a part of the amorphous silicon layer.

Referring to FIG. 3a, in step S376, the performing third dry etching includes: etching the exposed part of the amorphous silicon layer by using inert gas or nitrogen plasma, to form a groove on the amorphous silicon layer.

In an embodiment, the method for manufacturing the array substrate 20 includes: providing the first substrate 110; forming the gate layers 120 on the first substrate 110; forming the gate insulation layer 130 on the first substrate 110, and covering the gate layers 120; forming the amorphous silicon layer 140 on the gate insulation layer 130; forming the metal layer 150 on the amorphous silicon layer 140; forming the photo-sensitive photoresist layer 160 on the metal layer 150; etching the amorphous silicon layer 140 by using the inert gas or the nitrogen plasma, to form the groove 140C, and forming the source layer 150 and the drain layer 150; removing the photo-sensitive photoresist layer 160; and forming the passivation layer 170 on the source layer 150. The step of etching the amorphous silicon layer 140 by using the inert gas or the nitrogen plasma to form the groove 140C includes: performing first wet etching, first dry etching, second wet etching, second dry etching, and third dry etching. The mask is a gray scale mask or a half tone mask.

In an embodiment, a display panel manufacturing method includes: providing the first substrate 110; and providing a second base (not shown in the figure) disposed opposite to the first substrate 110; and includes the method for manufacturing the array substrate 20.

Figure 2I:
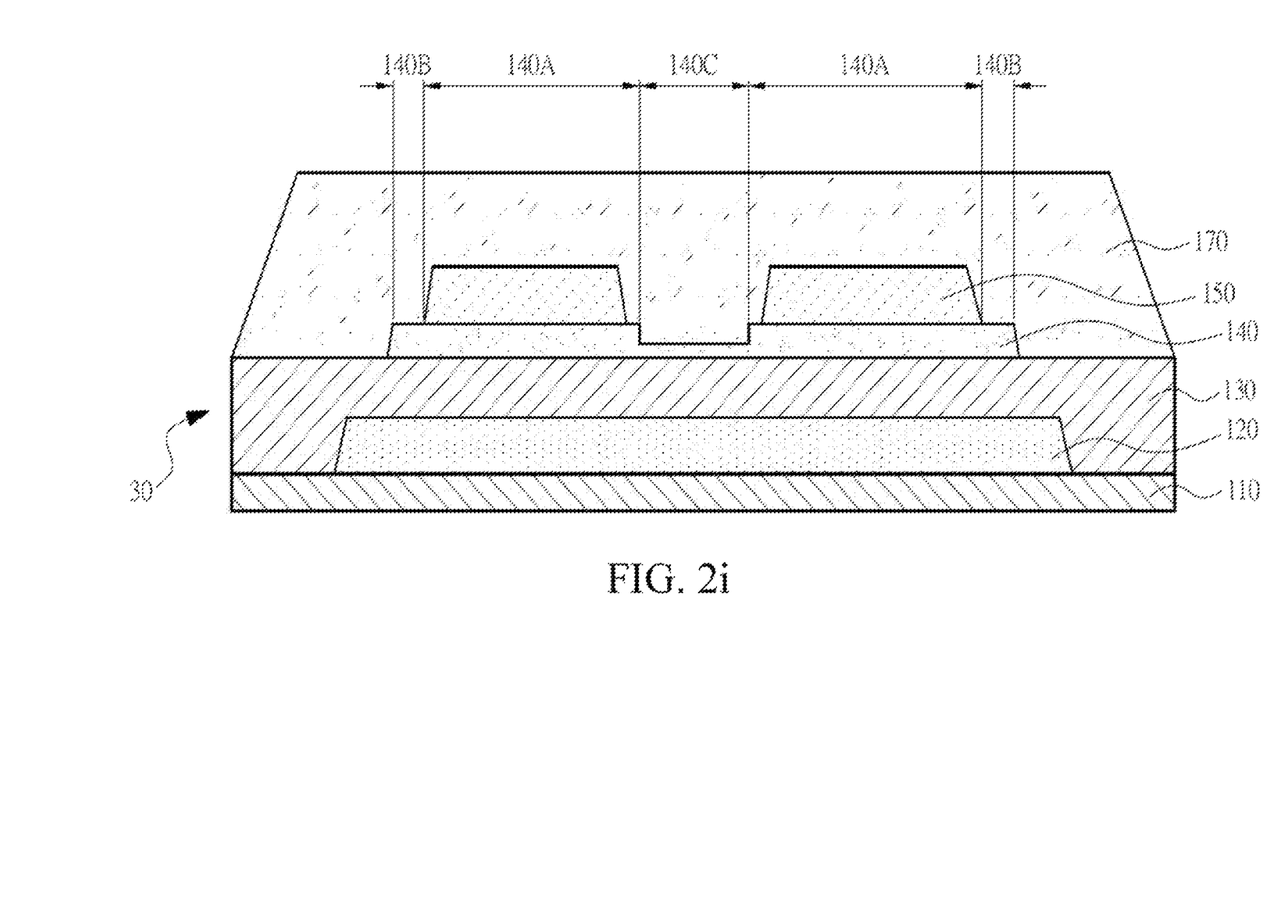

Referring to FIG. 2h and FIG. 2i, in an embodiment of this application, a display panel 30 includes the array substrate 20. The array substrate 20 includes: the first substrate 110; the plurality of gate layers 120, formed on the first substrate 110; the gate insulation layer 130, formed on the first substrate 110, and covering the gate layers 120; the amorphous silicon layer 140, formed on the gate insulation layer 130, where the amorphous silicon layer 140 includes the groove 140C; the source layer 150 and the drain layer 150, formed on the amorphous silicon layer 140; the passivation layer 170, formed on the gate insulation layer 130, and covering the source layer 150, the drain layer 150, and the amorphous silicon layer 140; an opposite substrate (not shown in the figure), including a second base (not shown in the figure), where the array substrate 20 is disposed opposite to the opposite substrate, and there are some light spacers (not shown in the figure) between the opposite substrate and the array substrate 20; and a transparent electrode layer (not shown in the figure), disposed on the second base.

Referring to FIG. 2h, in an embodiment, the inert gas may be helium gas, neon gas, argon gas, krypton gas, xenon gas, or radon gas.

Referring to FIG. 2h, in an embodiment, nitrogen in the nitrogen plasma is provided by the nitrogen group element and a compound thereof.

Referring to FIG. 2h, in an embodiment, a material of the gate insulation layer 130 is silicon nitride, silicon oxide, silicon oxynitride, aluminum oxide, or hafnium oxide.

Referring to FIG. 2i, in an embodiment of this application, a display apparatus includes a control component (for example, a multi-band antenna) (not shown in the figure), and further includes the display panel 30 (for example, a quantum dots light-emitting diode (QLED) panel or an organic light-emitting diode (OLED) panel or a liquid crystal display (LCD) panel).

By means of this application, a bulging part at an edge tail end of the amorphous silicon layer caused by a difference between a relatively large line width difference of wet etching on the source layer and a relatively small line width difference of the amorphous silicon layer can be reduced, and the relatively small bulging part at the edge tail end obviously suppresses a leakage current of an active switch component.

Phrases such as "in some embodiments" and "in various embodiments" are repeatedly used. The phrases generally do not indicate same embodiments, but may also indicate same embodiments. Unless otherwise described in the context, terms such as "include", "have", and "comprise" are synonyms.

The foregoing descriptions are merely embodiments of this application, and are not intended to limit this application in any form. Although this application has been disclosed above through the specific embodiments, the embodiments are not intended to limit this application. Any person skilled in the art can make some variations or modifications, namely, equivalent changes, according to the foregoing disclosed technical content to obtain equivalent embodiments without departing from the scope of the technical solutions of this application. Any simple amendment, equivalent change, or modification made to the foregoing embodiments according to the technical essence of this application without departing from the content of the technical solutions of this application shall fall within the scope of the technical solutions of this application.

What is claimed is:

1. A method for manufacturing an array substrate, comprising:

providing a first substrate;

forming gate layers on the first substrate;

forming a gate insulation layer on the first substrate, and covering the gate layers;

forming an amorphous silicon layer on the gate insulation layer;

forming a metal layer on the amorphous silicon layer;

forming a photo-sensitive photoresist layer on the metal layer;

etching the amorphous silicon layer by using inert gas or nitrogen plasma, to form a groove;

forming source layers and a drain layer;

removing the photo-sensitive photoresist layer; and forming a passivation layer on the source layers, wherein a baking process is performed on the photo-sensitive photoresist layer, so that the photo-sensitive photoresist layer flows to some extent so as to generate a protection layer, to cover the metal layer in a non-active switch channel region.

2. The array substrate manufacturing method according to claim 1, wherein the step of forming a photo-sensitive photoresist layer on the metal layer comprises:

coating the photo-sensitive photoresist layer, and enabling film thickness of the photo-sensitive photoresist layer to be not less than 2.5 μm.

3. The array substrate manufacturing method according to claim 2, wherein the step of forming a photo-sensitive photoresist layer on the metal layer comprises:

performing exposure processing by using a mask, and reducing film thickness of the photo-sensitive photoresist layer corresponding to an active switch channel region.

4. The array substrate manufacturing method according to claim 3, wherein the step of forming a photo-sensitive photoresist layer on the metal layer comprises:

forming a groove on the active switch channel region, and enabling film thickness of the groove to be greater than 0.5 μm.

5. The array substrate manufacturing method according to claim 3, wherein the mask is a gray scale mask.

6. The array substrate manufacturing method according to claim 3, wherein the mask is a half tone mask.

7. The array substrate manufacturing method according to claim 1, wherein the step of etching the amorphous silicon layer by using inert gas or nitrogen plasma, to form a groove comprises:
performing first wet etching, comprising:
performing first wet etching on the metal layer, and etching away the metal layer not covered by the photo-sensitive photoresist layer.

8. The array substrate manufacturing method according to claim 7, wherein the step of etching the amorphous silicon layer by using inert gas or nitrogen plasma, to form a groove comprises:
performing first dry etching, comprising:
etching the amorphous silicon layer, and etching away the amorphous silicon layer not covered by the photo-sensitive photoresist layer.

9. The array substrate manufacturing method according to claim 8, wherein the step of etching the amorphous silicon layer by using inert gas or nitrogen plasma, to form a groove comprises:
performing first dry etching, comprising:
performing a baking process on the photo-sensitive photoresist layer, to cover the metal layer.

10. The array substrate manufacturing method according to claim 9, wherein the step of etching the amorphous silicon layer by using inert gas or nitrogen plasma, to form a groove comprises:
performing second dry etching, comprising:
performing ashing on an active switch channel region of the photo-sensitive photoresist layer.

11. The array substrate manufacturing method according to claim 10, wherein the step of etching the amorphous silicon layer by using inert gas or nitrogen plasma, to form a groove comprises:
performing second dry etching, comprising:
etching away the groove on the photo-sensitive photoresist layer, to expose a part of the metal layer.

12. The array substrate manufacturing method according to claim 11, wherein the step of etching the amorphous silicon layer by using inert gas or nitrogen plasma, to form a groove comprises:
performing second wet etching, comprising:
etching the exposed part of the metal layer on the active switch channel region, and forming the source layers and the drain layer.

13. The array substrate manufacturing method according to claim 12, wherein the step of etching the amorphous silicon layer by using inert gas or nitrogen plasma, to form a groove comprises:
performing second wet etching, comprising:
etching the exposed part of the metal layer on the active switch channel region, to expose a part of the amorphous silicon layer.

14. The array substrate manufacturing method according to claim 13, wherein the step of etching the amorphous silicon layer by using inert gas or nitrogen plasma, to form a groove comprises:
performing third dry etching, comprising:
etching the exposed part of amorphous silicon layer by using the inert gas, to form the groove on the amorphous silicon layer.

15. The array substrate manufacturing method according to claim 13, wherein the step of etching the amorphous silicon layer by using inert gas or nitrogen plasma, to form a groove comprises:
performing third dry etching, comprising:
etching the exposed part of the amorphous silicon layer by using the nitrogen plasma.

16. The array substrate manufacturing method according to claim 15, wherein the step of etching the amorphous silicon layer by using inert gas or nitrogen plasma, to form a groove comprises:
performing third dry etching, comprising:
forming the groove on the amorphous silicon layer.

17. The array substrate manufacturing method according to claim 1, wherein the inert gas is helium gas, neon gas, argon gas, krypton gas, xenon gas, or radon gas.

18. The array substrate manufacturing method according to claim 1, wherein nitrogen in the nitrogen plasma is provided by the nitrogen group element and a compound thereof.

19. The array substrate manufacturing method according to claim 1, wherein a material of the gate insulation layer is silicon nitride, silicon oxide, silicon oxynitride, aluminum oxide, or hafnium oxide.

20. A method for manufacturing an array substrate, comprising:
providing a first substrate;
forming gate layers on the first substrate;
forming a gate insulation layer on the first substrate, and covering the gate layers;
forming an amorphous silicon layer on the gate insulation layer;
forming a metal layer on the amorphous silicon layer;
forming a photo-sensitive photoresist layer on the metal layer;
etching the amorphous silicon layer by using inert gas or nitrogen plasma, to form a groove, and forming source layers and a drain layer;
removing the photo-sensitive photoresist layer; and
forming a passivation layer on the source layers, wherein the step of etching the amorphous silicon layer by using inert gas or nitrogen plasma, to form a groove comprises: performing first wet etching, first dry etching, second dry etching, second wet etching, and third dry etching; and
the mask is a gray scale mask or a half tone mask.

* * * * *